United States Patent
Genevriere (12)

(10) Patent No.: US 6,397,341 B1
(45) Date of Patent: May 28, 2002

(54) METHOD FOR IMPROVING THE SPEED OF BEHAVIORAL SYNTHESIS LINKS TO LOGIC SYNTHESIS

(75) Inventor: Reiner Wilhelm Genevriere, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/384,136

(22) Filed: Aug. 27, 1999

(51) Int. Cl.[7] .......................... G06F 13/42; G06F 17/50; G06F 9/455; H04L 7/00
(52) U.S. Cl. .......................... 713/400; 703/19; 703/23; 716/6; 716/18
(58) Field of Search ............................... 713/400, 401; 716/1–6, 18; 703/13, 19, 23

(56) References Cited

U.S. PATENT DOCUMENTS

| | | | | |
|---|---|---|---|---|
| 5,111,413 A | * | 5/1992 | Lazansky et al. | 703/13 |
| 5,168,455 A | * | 12/1992 | Hooper | 716/18 |
| 5,404,319 A | * | 4/1995 | Smith et al. | 716/18 |
| 5,426,519 A | * | 6/1995 | Ginetti et al. | 716/6 |
| 5,910,897 A | * | 6/1999 | Dangelo et al. | 716/18 |
| 5,980,091 A | * | 11/1999 | Noble et al. | 713/400 |
| 6,026,228 A | * | 2/2000 | Imai et al. | 716/18 |
| 6,145,117 A | * | 11/2000 | Eng | 716/18 |
| 6,298,472 B1 | * | 10/2001 | Phillips et al. | 716/18 |

* cited by examiner

Primary Examiner—Thomas Lee
Assistant Examiner—Thuan Du
(74) Attorney, Agent, or Firm—Jonathan T. Kaplan; Howrey Simon Arnold & White, LLP

(57) ABSTRACT

Behavioral synthesis allows a circuit design to be specified in a high-level hardware description language (HLHDL) that is more oriented towards expressing the desired behavior than the underlying hardware mechanisms by which such behavior will be accomplished. The present invention permits behavioral synthesis to be accomplished with control chaining information, but with the control chaining information determined by a basic data-flow based pretiming. Control chaining is useful because it permits advanced scheduling techniques in which the computation of a conditional functional unit can be considered for scheduling in the same clock cycle as the functional units that depend on the evaluation of that conditional functional unit. The present invention speeds up the step of pretiming, responsible for determining control chaining information, by eliminating additional processing, beyond data-flow chaining, for determining control chaining ready times. Additional control chaining procedures are eliminated in the pretiming step by adding the following two steps to the behavioral synthesis process: i) following the translation of the HLHDL into an RTL circuit description, but before the step of pretiming, the RTL circuit description is temporarily altered such that the functional units activated by each control signal (i.e., activation signal) are in the transitive fanout of their control signal; and ii) once pretiming has been accomplished, the circuit representation is reverted back to its original state. Other than these two additional steps, a known process for behavioral synthesis can be followed.

16 Claims, 14 Drawing Sheets

Step 1500: Start with input HLHDL description of circuit design

Step 1510: Translate HLHDL into RTL high-level description

[Step 1515: Perform chaining transformation to RTL description]

Step 1520: Perform quick technology map of RTL description

[Step 1515: Perform chaining transformation to RTL description]

Step 1530: Pretime RTL-level design, at bit-level or gate-level resulting from quick technology map, using timing verifier Step 1535: Revert RTL description to its structure prior to Step 1515, except that chaining tables of Step 1530 are retained Step 1540: Perform the behavioral synthesis operations, of scheduling, resource sharing, allocation and post-annotation, on RTL-level design utilizing the pretiming information of Step 1530

Step 1550: Perform the logic synthesis operation of logic optimization

Step 1560: Output an optimized and technology-mapped circuit design

Step 1500: Start with input HLHDL description of circuit design

Step 1510: Translate HLHDL into RTL high-level description

Step 1520: Perform quick technology map of RTL description

Step 1530: Pretime RTL-level design, at bit-level or gate-level resulting from quick technology map, using timing verifier Step 1540: Perform the behavioral synthesis operations, of scheduling, resource sharing, allocation and post-annotation, on RTL-level design utilizing the pretiming information of step 1530

Step 1550: Perform the logic synthesis operation of logic optimization

Step 1560: Output an optimized and technology-mapped circuit design

FIG. 1
(PRIOR ART)

Step 210: Begin loop for each functional unit of RTL-level circuit design, referred to as "current functional unit"

Step 220: Set inputs of current functional unit to time zero

Step 230: Set all primary inputs to time minus infinity

Step 240: Time RTL-level design, at bit-level or gate-level resulting from quick technology map, using timing verifier Step 245: Create chaining table for current functional unit, referred to as "current chaining table"

Step 250: Record ready time of current functional unit in current chaining table Step 260: Begin looping for each functional unit in transitive fanout of current functional unit, referred to as "current transitive functional unit"

Step 270: Record ready time of any current transitive functional unit looped over in current chaining table Step 280: End loop of step 260

Step 290: End loop of step 210

FIG. 2
(PRIOR ART)

Step 1500: Start with input HLHDL description of circuit design

Step 1510: Translate HLHDL into RTL high-level description

[Step 1515: Perform chaining transformation to RTL description]

Step 1520: Perform quick technology map of RTL description

[Step 1515: Perform chaining transformation to RTL description]

Step 1530: Pretime RTL-level design, at bit-level or gate-level resulting from quick technology map, using timing verifier

Step 1535: Revert RTL description to its structure prior to Step 1515, except that chaining tables of Step 1530 are retained

Step 1540: Perform the behavioral synthesis operations, of scheduling, resource sharing, allocation and post-annotation, on RTL-level design utilizing the pretiming information of Step 1530

Step 1550: Perform the logic synthesis operation of logic optimization

Step 1560: Output an optimized and technology-mapped circuit design

FIG. 3

Step 2505: Begin after Step 1510 of 1520 of Figure 3

Step 2510: Begin loop for each activation condition of RTL description, referred to as "current activation condition"

Step 2520: Begin loop for each activated cell of the current activation condition, referred to as the "current activated cell"

Step 2530: Begin loop for each input of the current activated cell, referred to as the "current activated cell input"

Step 2540: Between the current activated cell input and its driving output insert a chaining cell, referred to as the "current chaining cell"

Step 2550: Connect control line of current chaining cell to current activation condition.

Step 2560: End loop of Step 2530

Step 2570: End loop of Step 2520

Step 2580: End loop of Step 2510

Step 2590: Continue with Step 1520 or 1530 of Figure 3

FIG. 5

```
module foo ( a, b, c, x, y, r, u, v, clk );
input clk;
input [1:0] a, b, c, x, y, u, v;
output [2:0] r;
reg [2:0] r;
always begin
            @ (posedge clk)
            if ( x < y ) begin
                r <= a + b - c;
            end
            else begin
                if (u < v ) begin
                    r<= b + c;
                end
            end
end
endmodule
```

FIG. 6A

```
module memory_v ( x, y, a, b, addr, clk );

input [3:0]  x, y, a, b, addr;
    input clk;

always begin : P reg [3:0] mem[3:0];

/* synopsys resource RAM : variables = "mem";*/

@ (posedge clk);

if ( x < y ) begin mem[addr] = a + b;

end else begin mem[addr] = b;

end end
endmodule
```

FIG. 7A

```
module foo ( a, b, c, x, y, r );

input [1:0] a, b, c, x, y;
    output [2:0] r;
    reg [2:0] r;

always begin if ( x < y )
            r <= a + b - c;
        else
            r <= b + c;

end endmodule
```

FIG. 8A

METHOD FOR IMPROVING THE SPEED OF BEHAVIORAL SYNTHESIS LINKS TO LOGIC SYNTHESIS

FIELD OF THE INVENTION

The present invention relates generally to behavioral synthesis, and more particularly to behavioral synthesis linked to logic synthesis.

BACKGROUND OF THE INVENTION

The following co-pending U.S. patent application, which is herein incorporated by reference, represents background to the present invention: "Behavioral Synthesis Links To Logic Synthesis," filed on May 12, 1995, with inventors Ronald A. Miller, Donald B. MacMillen, Tai A. Ly and David W. Knapp, having McDermott, Will & Emery docket number of 49725-021 and U.S. Pat. Ser. No. 08/440,101. This co-pending application will hereinafter be referred to as the Miller application.

Behavioral synthesis allows the designer of complex digital integrated circuits to specify the design at a relatively high-level of abstraction, which provides a variety of advantages in the design process. In particular, behavioral synthesis allows the design to be specified in a high-level hardware description language (HLHDL) that is more oriented towards expressing the desired behavior than the underlying hardware mechanisms by which such behavior will be accomplished. Some of the advantages of such behavioral HLHDL specifications are as follows. Since behavioral descriptions are closer to the overall behavior desired, they tend to be more intuitive and easier for the circuit designer to write. Behavioral descriptions tend to be shorter than more hardware-oriented descriptions and therefore tend to be quicker to write. Because behavioral descriptions are at a high-level of abstraction, they tend to simulate much faster than lower-level descriptions. All of these above advantages enhance the ability of the circuit designer to explore architectural alternatives and a variety of design trade-offs.

The basic process by which behavioral synthesis is accomplished, according to the Miller application, is shown in FIG. 1. The process of FIG. 1 is accomplished by the "Behavioral Compiler" product of Synopsys, Inc., 700 East Middlefield Road, Mountain View, Calif. The input representation is an HLHDL such as IEEE Standard 1076-1993 VHDL or IEEE Standard 1364-1995 Verilog HDL, both of which are herein incorporated by reference. Step 1510 translates the HLHDL into a "register transfer level" (RTL) description that includes high-level (i.e., multi-bit): functional units (with no delay or area information) and multiplexors. In contrast to the translation process as applied to conventional RTL synthesis, the current translation process does not infer any sequential elements. As a result, this netlist representation produced by the translation process only models data flow. Operations performed by functional units include: arithmetic operations, logical operations or conditional (i.e. comparison) operations. Note that the Miller application often uses the term "operation" to refer to what is herein called a functional unit. The logic synthesis link to behavioral synthesis is accomplished by Steps 1520 and 1530. Step 1520 performs a quick and approximate form of logic synthesis (i.e., technology mapping), in the midst of behavioral synthesis, to provide lower-level (typically gate-level or bit-level) circuit structure for the functional units that can then be timed by Step 1530. This lower-level representation is maintained in correspondence with the RTL description. Step 1530 performs pretiming of the circuit design produced by Step 1520, where timing information is added to the high-level functional units for use in subsequent behavioral synthesis operations. The subsequent behavioral synthesis operations are performed by Step 1540. The behavioral synthesis operations that can be performed include scheduling, resource sharing, allocation and post annotation. Once behavioral synthesis has been completed, and the circuit design has been fully optimized at a functional unit level, Step 1550 is executed such that a fully optimizing (and slow relative to Step 1520) form of logic synthesis can be done to result in an optimized gate-level description of the circuit design.

The scheduling operation of Step 1540 determines in which clock cycle each functional unit executes. The resource sharing operation of Step 1540 determines which functional units have hardware implementations that can be shared, for such reasons as their operating at mutually exclusive times. The allocation operation of Step 1540 maps the functional units into a specific hardware architecture, such as a "datapath" comprising: memories, registers, arithmetic units, logical units and routing units. Functional units which require more than one clock cycle to execute are also annotated, by Step 1540, as requiring multiple cycles. This annotation prevents the logic optimizer 1550 from attempting to fit such functional units into a single cycle.

Scheduling is a crucial behavioral synthesis activity since its assignment of functional units to clocks cycles determines such key characteristics of the overall design implementation as: clock period, latency and throughput. The delay information, aquired by Step 1530, is essential to the scheduling process.

FIG. 2 depicts the basic procedure by which pretiming of a design, as called for by Step 1530 of FIG. 1, is accomplished in the Miller application. This procedure produces, for each functional unit, a "chaining table." The chaining table provides the scheduling process of Step 1540 with delay information in a convenient form which allows the scheduler to readily ascertain the maximum number of functional units that can be fit into a clock cycle. Step 210 loops through each functional unit. For each functional unit iterated over, which shall be called the current functional unit, the following is performed. Step 220 sets all inputs of the current functional unit to time zero. All primary inputs of the circuit are set to minus infinity by Step 230. Note that inputs to the current functional unit which have been set to zero remain at zero regardless of whether it is fed by a primary input. Further note that between Steps 280 and 290 the inputs of the current functional unit must be released from their zero setting before the next current functional unit has its inputs set to zero by Step 220 in the next iteration. The entire circuit design is then timed using a conventional timing verifier (also known as a timing analyzer), such as Design Time or Prime Time, both available from Synopsys, Inc., 700 East Middlefield Road, Mountain View, Calif. Step 240. A chaining table data structure for the current functional unit, which we shall refer to as the current chaining table, is created. Step 245. Each chaining table data structure should be able to function as a set of tuples. Each tuple contains a functional unit identifier and a functional unit ready time for that functional unit, wherein the ready time has been determined relative to the current functional unit to which the chaining table is attached. In Step 250 the first entry to the current chaining table, such first entry having the ready time of the current functional unit, is added. Next, each functional unit in the transitive fanout of the current functional unit, which shall be referred to as the current fanout unit, is iterated over. Step 260. The ready time of each current fanout unit is recorded in the current chaining table. Step 270.

The procedure of FIG. 2 is limited to entering, in the current chaining table, those functional units which are part of the data flow (i.e. transitive fanout) of the current functional unit. For the purposes of scheduling, it is important to be able to augment the traversal of the RTL network (i.e., RTL description), by Step 260, to be beyond those functional units reachable solely by a data flow search. In particular, conditional functional units of the RTL network can be related to other functional units of the RTL network by "activation conditions." A definition of activation condition follows.

An "activation condition" is a signal line or lines of the RTL description which are caused to carry a control code in response to the evaluation of a comparator (or conditional) functional unit. In terms of the input Verilog HDL or VHDL description, an activation condition causes functionality, specified in a conditional statement, to be evaluated in response to the conditional expression portion of the conditional statement evaluating to a particular value. A typical exemplary conditional statement is of the form "if (<conditional expression>) then <activated functionality> else <activated functionality>." For this example, items between angle brackets ("<" or ">") are meta-variables which are to be filled in with a programming language construct of the type described by the meta-variable. If <conditional expression> evaluates to TRUE, then an activation condition is generated, in the corresponding RTL description, such as to cause the functionality specified by <activated functionality1> to be performed. Similarly, if <conditional expression> evaluates to FALSE, then another activation condition is generated, in the corresponding RTL description, such as to cause the functionality specified by <activated functionality2> to be performed. The final output, of that portion of the RTL description that models the <conditional expression>, is from a comparator functional unit. It is this comparator functional unit that drives, typically through a buffer and an inverter, the activation conditions. The buffer or inverter for driving an activation condition is not a type of functional unit.

It is often the case that a conditional statement is translated into an RTL description where the activation condition: i) is wired to select an input of one or more multiplexors and ii) indicates the RTL functional units (which we shall refer is to collectively as the activation condition's "activated cells") that are to be evaluated. In such cases, each multiplexor is preferably controlled by "1-hot" encoding, as such encoding is commonly known in the art of digital hardware design. The number of multiplexors is determined by the number variables that are assigned a new value as a result of the conditional statement. It is also typically the case that the activated cells are within the transitive fanin of the selected multiplexor inputs. An example of a Verilog HDL program, and the activation conditions it produces, are shown in FIGS. 6A and 6B. FIG. 6A depicts the Verilog HDL source code, while FIG. 6B depicts a circuit representation determined from it. FIG. 6B depicts four activation conditions numbered: 635, 640, 645 and 650. Activation conditions 645 and 650 are the result of evaluating conditional functional unit 630, while activation conditions 635 and 640 are the result of evaluating conditional functional unit 625. Activation condition 650 corresponds to the "else" clause, if the test for x<y is FALSE. Note that the activation condition 650 only indicates its activated cells to be comparator 625, since that is the only functional unit which is necessarily executed. Activation condition 645 indicates its activated cells are adder functional unit 615 and subtractor functional unit 610. Activation condition 635 indicates its activated cells to be adder functional unit 620, while activation condition 640 has no functional units executed in response to its assertion.

Alternatively, an activation condition may simply indicate activated cells, without also controlling a multiplexor. An example of such a multiplexor-less activation condition would be, for example, an activation condition which activates a functional unit that writes data to a memory address upon being activated. Such an activation condition could result from a Verilog HDL or VHDL description regarding the writing of data into an array, where the data written into the array depends upon the evaluation of a conditional statement. Step 1510 would typically translate such an array into an RTL-level block of random-access memory (RAM). A functional unit would typically be created to represent the action of storing one type of data, into the selected address of the RAM, if the conditional expression of the conditional statement evaluates to a particular value. In response to the conditional expression evaluating to other values, other functional units, storing other types of data into the RAM, could be activated. An example of such a Verilog HDL program, and the activation conditions it produces, are shown in FIGS. 7A and 7B. FIG. 7A shows that if the conditional expression x<y is TRUE, then a+b is stored in the RAM "mem" at address "addr," whereas otherwise the value of b is stored in "mem" at address "addr." In FIG. 7B, conditional expression "x<y" becomes conditional functional unit 700 which produces activation conditions 710 (if functional unit 700 produces a TRUE) and 705 (if functional unit 700 produces a FALSE). As can be seen, activation conditions 710 and 705 only indicate functional units as activated cells to be evaluated and are not wired to select a multiplexor input. Specifically, activation condition 710 indicates that its activated cells are adder 725 and memory write operation 720, while activation condition 705 indicates that its activated cell is memory write operation 715.

It should be noted that the activated cells, for an activation condition, are merely indicated (by, for example, a list associated with the activation condition) and are not wired to the activation condition such that they are in the activation condition's transitive fanout.

Since Step 260 of the pretiming procedure of FIG. 2 only follows the transitive fanout of the current functional unit, it is not able to traverse activation conditions and include the additional functional units, that would be located by such an augmented network traversal, in the chaining table of the current functional unit.

It is useful, for scheduling purposes, to traverse activation conditions, during chaining table creation, by considering the functional unit directly driving an activation condition as occurring temporaly before those functional units indicated as the activated cells of the activation condition.

Since activation conditions indicate a flow of control, as opposed to data flow, traversal of activation conditions for purposes of creating chaining table entries is referred to as "control chaining."

Control chaining is useful because it permits advanced scheduling techniques in which the computation of a conditional functional unit can be considered for scheduling in the same clock cycle as the functional units that depend on the evaluation of that conditional functional unit.

The desired default temporal relation, for most practical purposes, is a scheduling of the conditional functional unit in serial with those functional units that depend on it. This type of serialization tends to save area in the resulting integrated circuit design by providing greater opportunity for hardware to be shared among the functional units. For example, since the result of the conditional functional unit is already known when the functional units that depend on it need to calculate their values, the same piece of hardware may be used for both: i) the functional units activated for a TRUE result of the conditional functional unit and ii) the functional units activated for a FALSE result of the same conditional functional unit.

The Miller application addresses the problem of control chaining by adding special procedures to the basic pretiming procedure of FIG. 2.

The control chaining procedures of the Miller application are relatively complex and slow. These procedures are particularly slow when pretiming of "nested" activation conditions is to be accomplished. An example of nested activation conditions is shown in FIG. 6B where activation conditions 635 and 640 are "nested" within activation condition 650. This is due to the fact that the conditional statement testing for u<v is nested within the conditional statement testing for x<y. In general, a nesting of conditional statements results in a nesting of activation conditions.

It would be desirable to increase the overall speed of behavioral synthesis by eliminating the additional processing, of the pretiming process 1530, associated with control chaining as described in the Miller application.

SUMMARY OF THE INVENTION

The present invention permits behavioral synthesis to be accomplished with control chaining information, but with the control chaining information determined by a basic data-flow based pretiming. Thus the present invention speeds up the step of pretiming, with respect to the Miller application, by eliminating its additional processing for determining control chaining ready times. Additional control chaining procedures are eliminated by adding the following two steps to the behavioral synthesis process: i) following the translation of the HLHDL into an RTL circuit description, but before the step of pretiming, the RTL description is temporarily altered such that the functional units activated by each control signal (i.e. activation condition) are in the transitive fanout of their control signal; and ii) once pretiming has been accomplished, the circuit representation is reverted back to its original state. Other than these two additional steps, the known process for behavioral synthesis can be followed.

The RTL circuit description is temporarily altered by the following triply-nested loops. Each activation condition is looped over (yielding a current activation condition for each iteration), and within this loop each activated cell of the current activation condition is looped over (yielding a current activated cell for each iteration). The current activated cell is put within the transitive fanout of the current activation condition by looping over each input of the current activated cell (yielding a current activated cell input for each iteration) and performing the following alteration upon it. A "chaining cell," referred to as the current chaining cell, is inserted between the current activated cell input and the source driving the current activated cell input (this source for driving the current activated cell input being referred to as the "driving output"). A chaining cell consists of a two-input AND gate (of zero delay) for each bit of the current activated cell input. Each bit of the current activated cell input is driven by the output of a different two-input AND gate of the current chaining cell. One input of each AND gate is connected to the corresponding bit of the driving output. The other input of each AND gate of the current chaining cell is connected to the current activation condition.

Due to chaining cells increasing the loading of activation condition nodes, it may also be desirable to annotate activation condition nodes with directives instructing the timing analyzer, utilized in pretiming, to count the activation condition nodes as having zero propagation delay.

Reverting the RTL circuit description, after the pretiming has been accomplished, is performed by a procedure which is very similar to the above triply-nested loops for altering the RTL circuit description, except that within the innermost loop, the current chaining cell is removed from the current activated cell input and the current chaining cell is disconnected from the current activation condition. Reversion does not remove the chaining tables produced by pretiming and therefore these tables are available for the subsequent steps of behavioral synthesis.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 1 shows logic synthesis linked to behavioral synthesis in accordance with the Miller application;

FIG. 2 depicts the generation of chaining tables, to accomplish the step of pretiming, in accordance with the Miller application;

FIG. 3 illustrates logic synthesis linked to behavioral synthesis in accordance with the principles of the present invention;

FIG. 5 Depicts a procedure for performing a chaining transformation of a circuit to be timed, in accordance with the present invention;

FIGS. 6A and 6B depict, respectively, a Verilog HDL design and the initial circuit generated therefrom with activation conditions that are nested and which are wired to a multiplexor in addition to indicating functional units;

FIGS. 7A and 7B depict, respectively, a Verilog HDL design and the initial circuit generated therefrom with activation conditions that are not wired to a multiplexor but which only indicate functional units;

FIGS. 8A, 8B, 8C and 8D show an exemplary application of the present invention, beginning with an initial Verilog HDL design, proceeding to a circuit representation, proceeding further to a modified circuit representation with chaining cells and ending with a reverted circuit representation with the chaining tables retained.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

The focus of the present invention is to speed-up the operation of Step 1530 by eliminating the need for this Step to handle control chaining in the course of its production of chaining tables. As discussed above, the operation of Step 1530 is depicted in FIG. 2. The present invention allows the basic chaining table algorithm of FIG. 2 to accomplish control chaining by its processing of an altered gate-level circuit structure whose delays are to be timed. Once the chaining tables have been generated by Step 1530, the structure of the circuit can be reverted back to its original state and behavioral synthesis (followed by logic synthesis) can then continue, from that point onwards, in the same manner as presented in FIG. 1.

More specifically, the present invention alters the processing shown in FIG. 1 as follows. FIG. 3 depicts FIG. 1, altered in accordance with the principles of the present invention. These alterations are underlined. Between Steps 1510 and 1520, or between Steps 1520 and 1530, of FIG. 3, the chaining transformation 1515 of the present invention is performed. This selectivity, as to the location of Step 1515, is indicated in FIG. 3 by enclosing it in square brackets. Between Steps 1530 and 1540, the circuit is reverted back to the structure it had before being transformed by Step 1515, with the exception that the chaining tables obtained, by timing the circuit as altered by chaining transformation 1515, are retained.

Step 1515 of the present invention transforms the circuit representation produced by Step 1510 as follows. The chaining transformation process is also depicted in FIG. 5. As indicated in FIG. 5, this chaining transformation process can be performed after Step 1510 or 1520, since the quick technology mapping performed by Step 1520 is irrelevant with respect to performing the circuit alteration of Step 1515.

Figure 4:
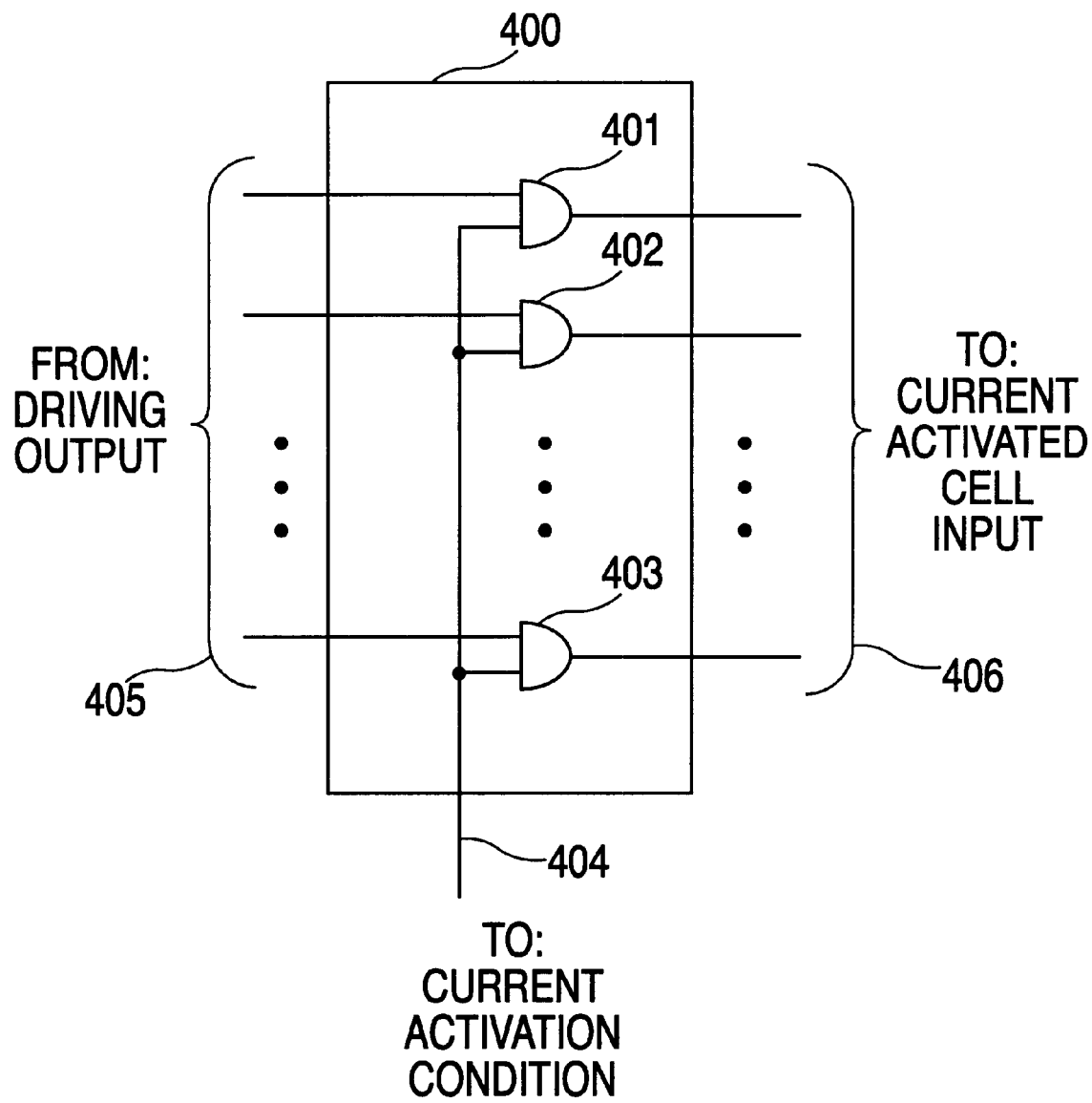
FIG. 4 shows a chaining cell in accordance with the present invention.

Each "activation condition" of the RTL description is iterated over and shall be referred to as the "current activation condition." Step 2510. Within the outermost loop 2510, an inner loop 2520 iterates over each activated cell of the current activation condition, which shall be referred to as the current activated cell. A further inner loop 2530 iterates over each input of the current activated cell, which shall be referred to as the current activated cell input. The output of the functional unit, or the primary input, that drives the current activated cell input shall be referred to as the "driving output" for that current activated cell input. Between the current activated cell input and its driving output, a special cell, which we shall refer to as a "chaining cell," is inserted. Step 2540. The construction of a chaining cell is shown in FIG. 4. As can be seen, the chaining cell 400 consists of as many two-input AND gates as there are bits for the current activated cell input. The outputs of chaining cell 400, indicated by bracket 406, are connected to the current activated cell input. The inputs of chaining cell 400, indicated by bracket 405, are connected to the driving output for the current activated cell input. Three exemplary AND gates 401, 402 and 403 are shown. Each of the AND gates comprising chaining cell 400 has zero delay and all are gated by a common control line 404. For the purposes of the timing analyzer, each AND gate acts to propagate the worst case ready time among its inputs. The control line 404 of the chaining cell is connected to the current activation condition. Step 2550. After this nested loop structure has completed, with Steps 2560, 2570 and 2580 "falling through," processing continues with either Step 1520 or 1530 of FIG. 1.

Step 1520 performs its quick technology map in the same manner as described above.

Figure 6B:
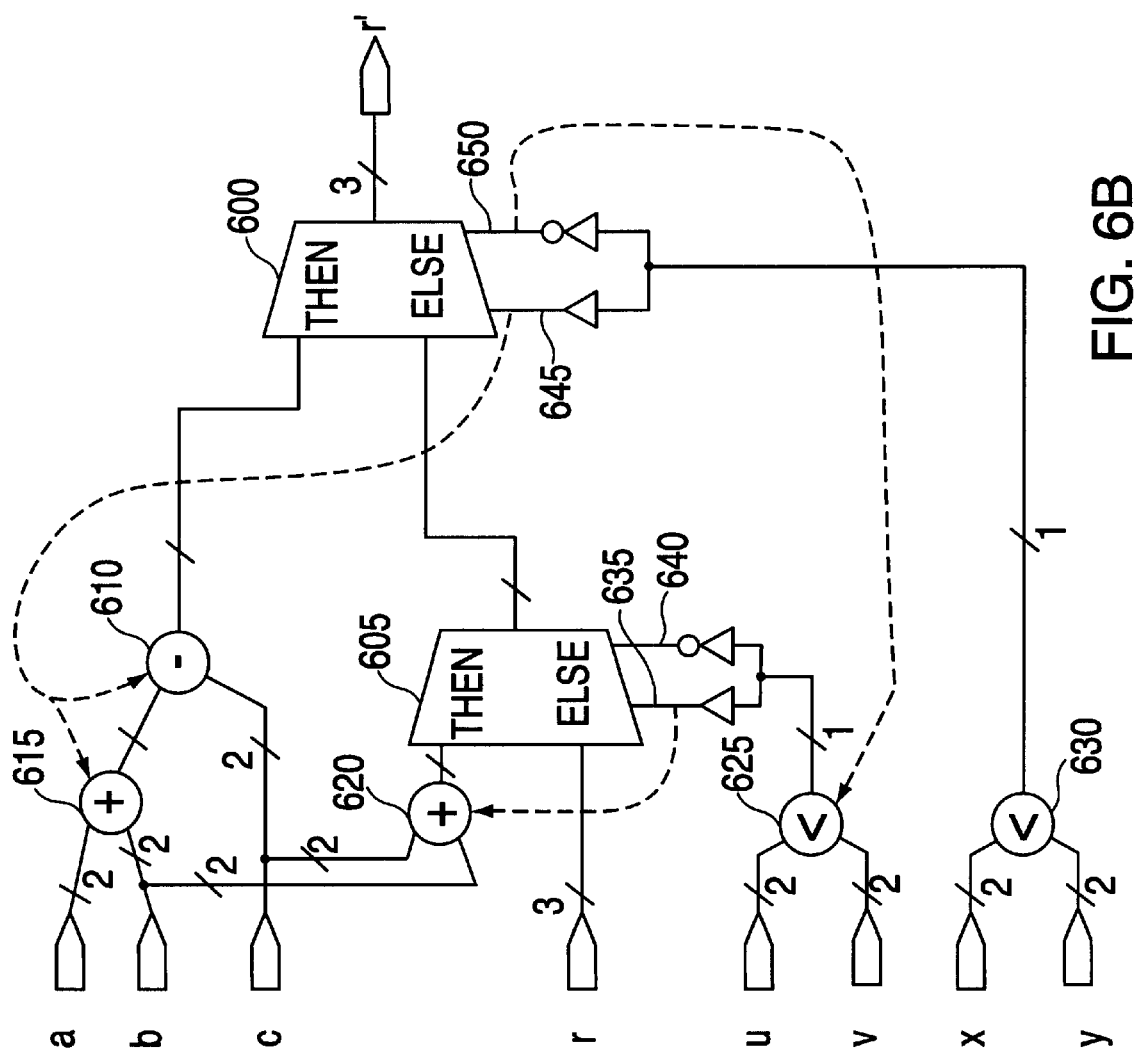
Figure 7B:
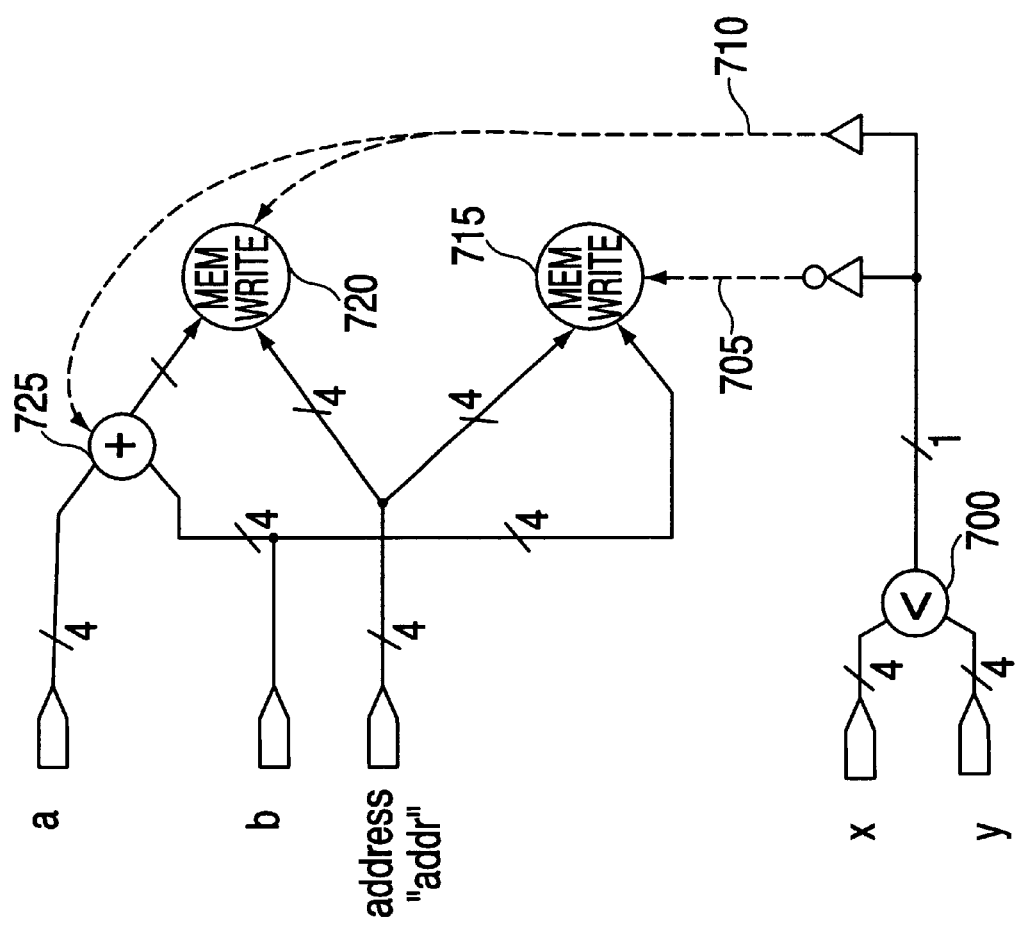

This modified circuit, with the inserted chaining cells, is timed in accordance with Step 1530, as described above with respect to FIG. 2, and no special control chaining procedure is needed when encountering activation conditions since the chaining cells have connected any activated cells selected by an activation condition into the transitive fanout of the appropriate activation condition. Therefore, the chaining table of any functional unit producing activation conditions in its transitive fanout includes entries for each of the functional unit's activated cells. The chaining table of any functional unit will also include entries for the activated cells of any nested activation conditions. For example, applying the pretiming procedure of FIG. 2, to the circuit of FIG. 6B after being modified by the chaining transformation of FIG. 5, produces the following results with respect to nested activation conditions. The chaining table for comparator functional unit 630 of FIG. 6B will include an entry for adder functional unit 620, where adder 620 is activated by activation condition 635 that is nested within activation condition 650.

The fact that the special control chaining procedures of the Miller application are no longer needed by Step 1530 means that this step of pretiming can be accomplished with significantly greater speed. This speed improvement over the Miller application procedures is particularly evident when pretiming of "nested" activation conditions is to be accomplished. An example of nested activation conditions has been discussed above with respect to FIG. 6B where activation conditions 635 and 640 are "nested" within activation condition 650.

It should be noted, however, that the modification of the circuit representation to include chaining cells may create activation conditions that drive a very large number of gates. If the timing analyzer utilized by Step 1530 of FIG. 3 (and more specifically by Step 240 of FIG. 2) includes the propagation delay of the signal lines (or node) representing an activation condition, in addition to device delay, this very large loading of the activation condition nodes can lead to inaccurate timing results for the chaining tables. This problem can be overcome by annotating the activation condition nodes with directives instructing the timing analyzer to count the node as having zero propagation delay. The characteristic of a timing analyzer counting node propagation delay is not desirable for the type of timing information sought during logic synthesis links to behavioral synthesis, but such a characteristic is often included among commonly available timing analyzers and therefore the above-described approach of including zero propagation delay directives may be necessary.

Once the RTL level description has been timed by Step 1530, the circuit representation is reverted by Step 1535 back to its original state before the chaining cells were inserted by Step 1515, except that the chaining tables are retained. This permits the succeeding behavioral synthesis and logic synthesis operations to proceed with the necessary data in the chaining tables but without the presence of chaining cells that would alter the circuit from the functionality desired by the circuit designer. This reversion can be accomplished by a procedure which is very similar to that of FIG. 5, except that Steps 2540 and 2550, respectively, remove the chaining cell and disconnect the chaining cell's control line from the current activation condition.

Example Circuit Design

Figure 8B:
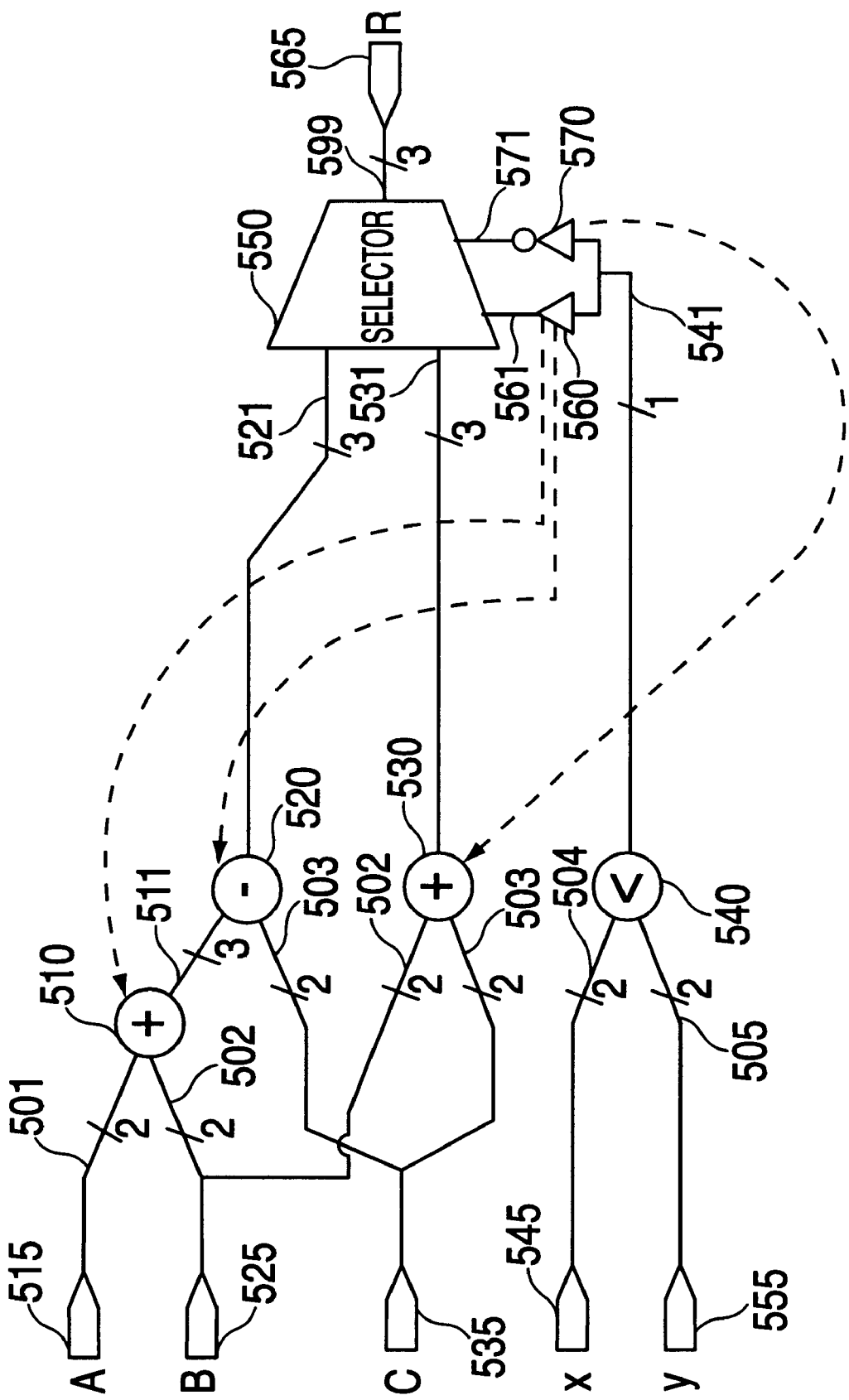

FIGS. 8A, 8B, 8C and 8D illustrate application of the present invention to an example circuit design. FIG. 8A shows the initial Verilog HDL specification prepared by the circuit designer. FIG. 8B depicts a translation of that Verilog HDL, in accordance with step 1510, to produce a circuit representation. This circuit contains two activation conditions, labeled 571 and 561, produced by conditional functional unit 540. Activation condition 571 indicates its activated cells to be adder 530, while activation condition 561 indicates its activated cells to be adder 510 and subtractor 520.

Figure 8C:
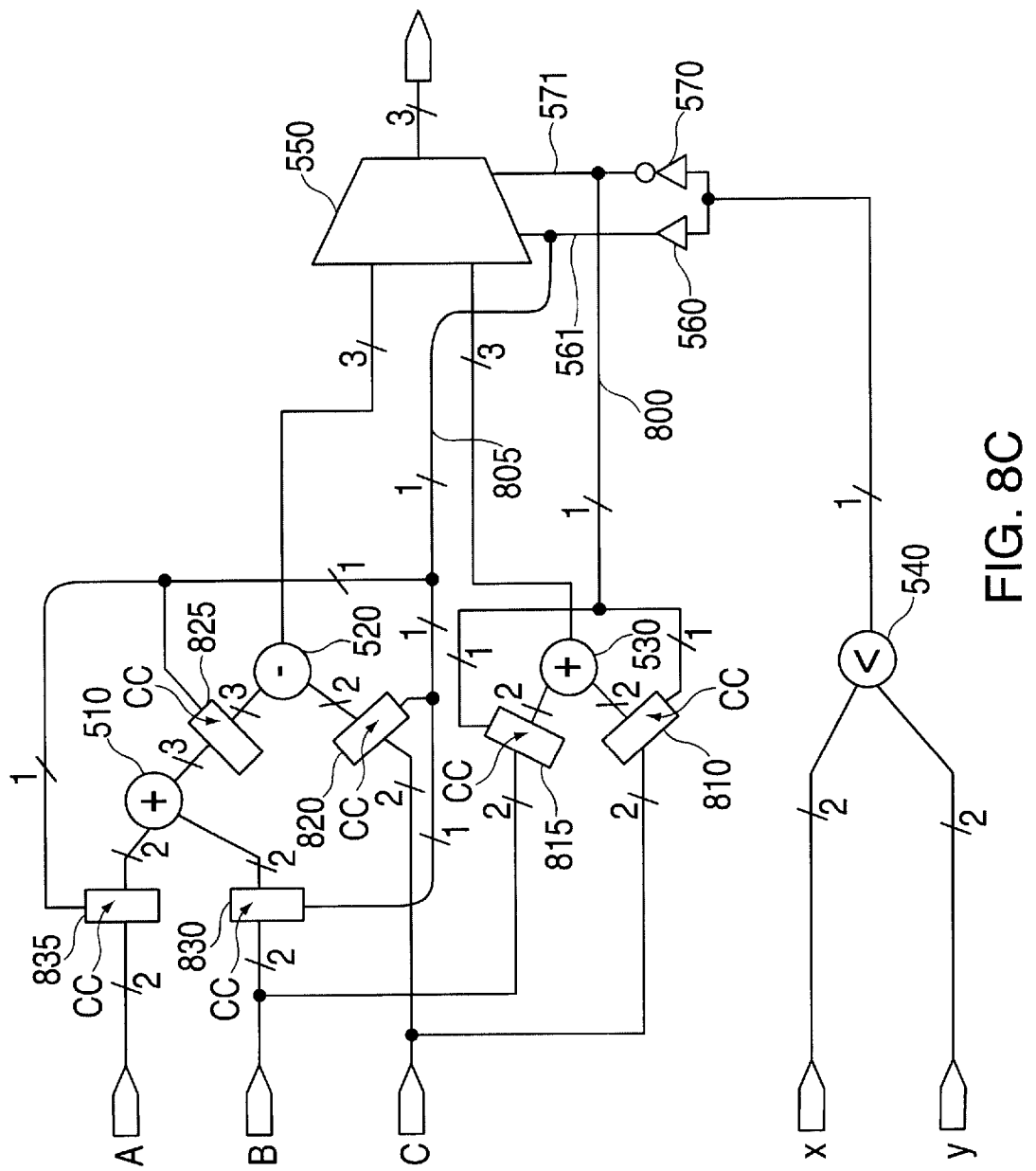

FIG. 8C depicts the circuit representation of FIG. 8B, after it has been changed by chaining transformation Step 1515 of FIG. 3. As can be seen, activated cell 530 of activation condition 571 has had chaining cells 810 and 815 added to each of its inputs. The chaining cells are controlled by a wire from activation condition 571, thus putting chaining cells 810 and 815 in the transitive fanout of activation condition 571. Activated cells 510 and 520, of activation condition 571, have had chaining cells 820–835 added to their inputs. The chaining cells are controlled by a wire from activation condition 561, thus putting chaining cells 820–835 in the transitive fanout of activation condition 561.

Figure 8D:
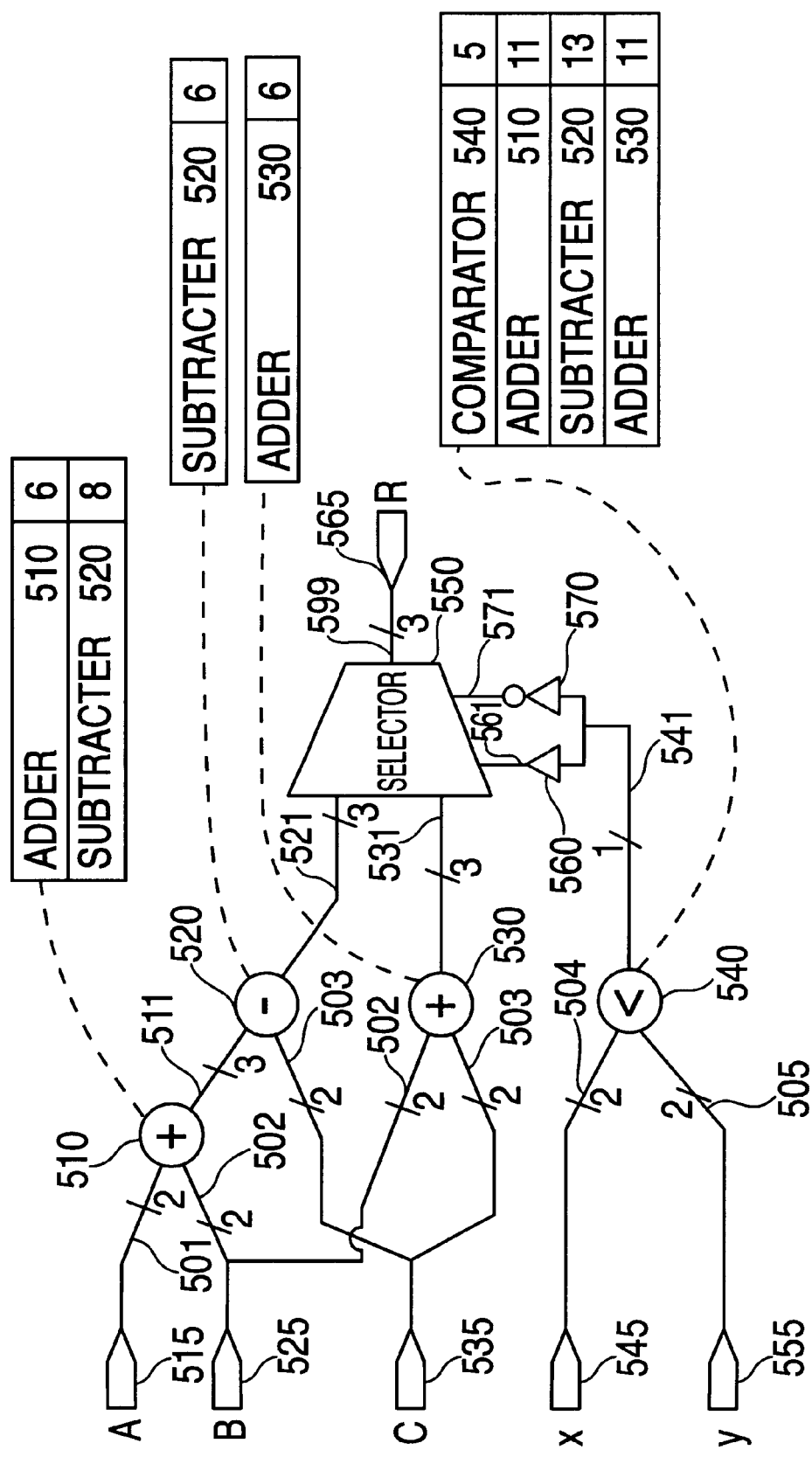

FIG. 8D shows the results of computing chaining tables for the circuit of FIG. 8C in accordance with Step 1530 of FIG. 3. FIG. 8D shows the circuit of FIG. 8C after it has been reverted, by Step 1535 of FIG. 3, back to the state of FIG. 8B, except that the chaining tables are retained. As can be seen, each functional unit has its own chaining table. Adder 510 has an entry for itself and for subtractor 520 of its transitive fanout. Subtractor 520 just has an entry for itself. Adder 530 just has an entry for itself. Comparator 540 has an entry for itself, as well as for its activated cells adder 510, subtractor 520 and adder 530. Note that since buffer 560 and inverter 570 are not functional units, neither has a chaining table and neither is included as an entry in the chaining table of comparator functional unit 540. It is worthwhile pointing out that while subtractor 520 has a ready time delay of 6 units by itself, it adds only 2 units of delay in the chaining table for adder 510. This is due to the fact that the pretiming of Step 1530 is accomplished with the quick-technology-mapped representation produced by Step 1520 which allows for the bit-level (or gate-level) propagation of results from adder 510 to substractor 520.

HARDWARE ENVIRONMENT

Figure 9:
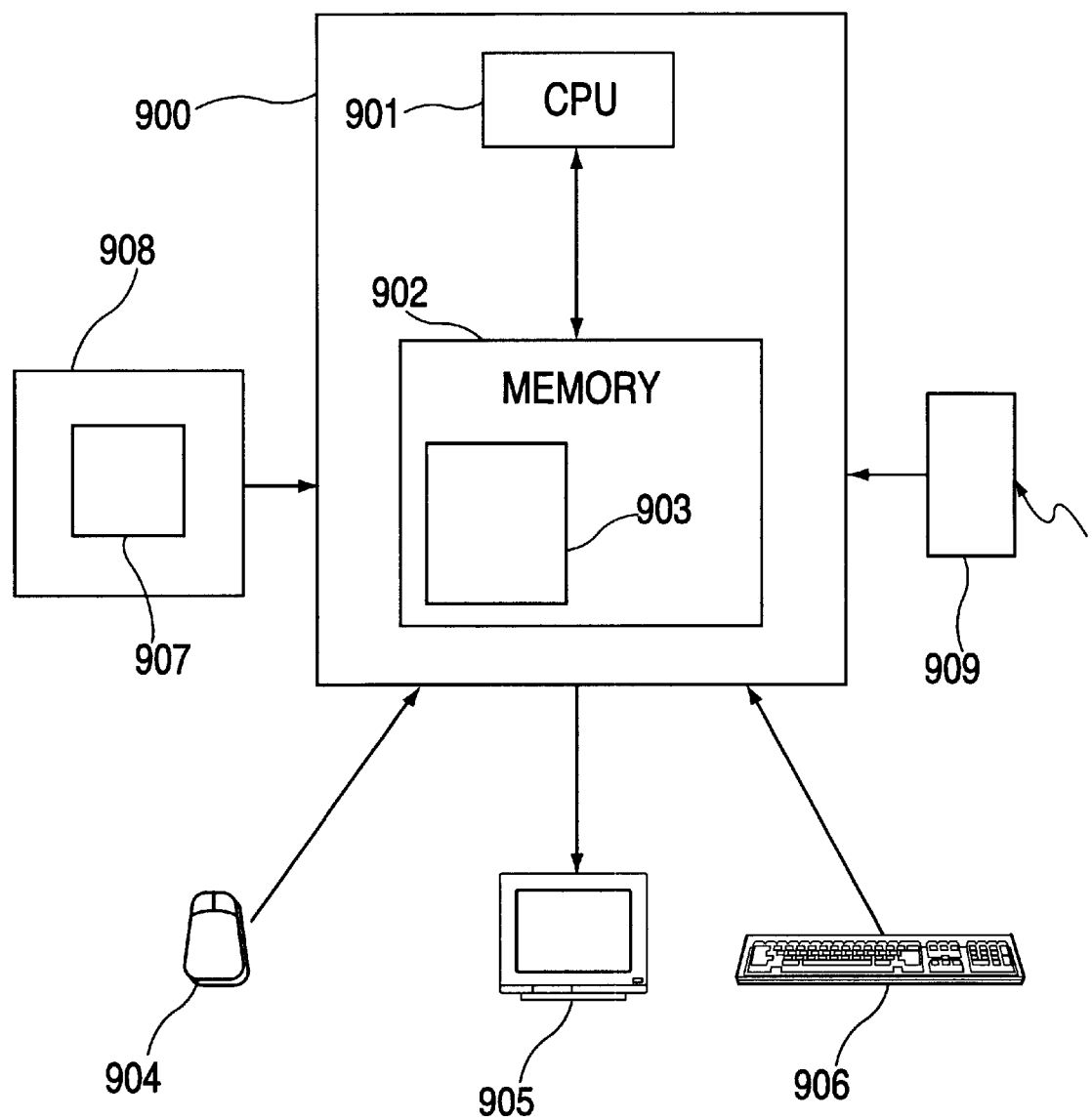
FIG. 9 depicts an exemplary hardware environment for execution of the synthesis architecture presented.

Typically, the synthesis architecture of the present invention is executed within the computing environment (or data processing system) such as that of FIG. 9. FIG. 9 depicts a workstation computer 900 comprising a Central Processing Unit (CPU) 901 (or other appropriate processor or processors) and a memory 902. Memory 902 has a portion of its memory in which is stored the software tools and data of the present invention. While memory 903 is depicted as a single region, those of ordinary skill in the art will appreciate that, in fact, such software may be distributed over several memory regions or several computers. Furthermore, depending upon the computer's memory organization (such as virtual memory), memory 902 may comprise several types of memory (including cache, random access memory, hard disk and networked file server). Computer 900 is typically equipped with a display monitor 905, a mouse pointing device 904 and a keyboard 906 to provide interactivity between the software of the present invention and the chip designer. Computer 900 also includes a way of reading computer readable instructions from a computer readable medium 907, via a medium reader 908, into the memory 902. Computer 900 also includes a way of reading computer readable instructions via the Internet (or other network) through network interface 909.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method performed by a data processing system having a memory, comprising the steps of:

translating a textual input representation of a digital circuit in memory into a first circuit representation;

identifying a first operator unit of the first circuit representation as producing a first control code;

identifying a second operator unit of the first circuit representation as being evaluated upon production of the first control code;

identifying at least a first input of the second operator;

identifying at least a first driving unit coupled to the first input of the second operator;

inserting, within the coupling between the first driving unit and the first input of the second operator, a first control-chaining unit, wherein the first control-chaining unit has at least a data input, a data output and a control input, and wherein the data input and the data output of the first control-chaining unit are inserted within the coupling;

coupling the control input of the first control-chaining unit to a source of the first control code;

mapping the first circuit representation into a second lower-level circuit representation;

determining chaining tables for the first circuit representation level by timing the second circuit representation;

reverting the first circuit representation to a state it was in prior to the insertion of the first control-chaining unit; and performing behavioral synthesis of the first circuit representation according to the chaining tables.

2. The method of claim 1, wherein the first control-chaining unit is comprised of AND functions.

3. The method of claim 2, wherein the control input of the first control-chaining unit is coupled to an input of each AND function.

4. The method of claim 1, wherein the first control-chaining unit is of zero delay between all of its inputs and its data output.

5. The method of claim 1, wherein the evaluation of the second operator upon production of the first control code is determined by a scope of activated functionality specified as part of the textual input representation.

6. The method of claim 1, wherein the step of mapping is performed immediately after the step of translating the textual input representation.

7. The method of claim 1, wherein the step of mapping is a technology mapping operation.

8. The method of claim 1, wherein a node for transmitting the first control code is annotated with a directive instructing the timing of the second circuit representation to count as being of a zero value a propagation delay for the node for transmitting the first control code.

9. The method of claim 1, wherein the behavioral synthesis performed is scheduling.

10. The method of claim 1, further comprising a step of logic synthesis following performance of the step of performing behavioral synthesis.

11. The method of claim 1, further comprising the step of identifying a first selection unit of the first circuit representation with at least a first selectable input and a control input, wherein the first selectable input is selected in response to application of the first control code to the control input.

12. The method of claim 11, wherein the second operator is within a transitive fanin of the first selectable input of the first selection unit.

13. The method of claim 1, wherein the second operator unit stores data to a memory upon production of the first control code.

14. The method of claim 1, wherein the textual input representation is in a programming language specification.

15. The method of claim 14, wherein the programming language specification is a hardware programming language specification.

16. The method of claim 1, wherein the first control code is 1-hot encoded.

* * * * *